(12) United States Patent
Iwai et al.

(10) Patent No.: US 7,013,443 B2
(45) Date of Patent: Mar. 14, 2006

(54) DELAY DIAGNOSIS METHOD FOR SEMICONDUCTOR INTEGRATED CIRCUIT, COMPUTER PROGRAM PRODUCT FOR DIAGNOSING DELAY OF SEMICONDUCTOR INTEGRATED CIRCUIT AND COMPUTER READABLE RECORDING MEDIUM RECORDING PROGRAM THEREON

(75) Inventors: Yoshihiro Iwai, Nakai (JP); Tatsuki Ishii, Nakai (JP); Kenji Shigeoka, Nakai (JP); Hirotake Tokuyama, Hadano (JP)

(73) Assignees: Hitachi, Ltd., Tokyo (JP); Hitachi Information Technology Co., Ltd., Kanagawa (JP)

( * ) Notice: Subject to any disclaimer, the term of this patent is extended or adjusted under 35 U.S.C. 154(b) by 420 days.

(21) Appl. No.: 10/393,921

(22) Filed: Mar. 24, 2003

(65) Prior Publication Data

US 2003/0226126 A1 Dec. 4, 2003

(30) Foreign Application Priority Data

Mar. 27, 2002 (JP) ............................. 2002-087391

(51) Int. Cl.
*G06F 17/50* (2006.01)
(52) U.S. Cl. ...................... 716/6; 716/1; 716/9; 716/18
(58) Field of Classification Search .................... 716/1, 716/6, 9, 18; 702/79
See application file for complete search history.

(56) References Cited

U.S. PATENT DOCUMENTS

2005/0107970 A1 * 5/2005 Franch et al. .................. 702/79

FOREIGN PATENT DOCUMENTS

| JP | 2888708 | 2/1999 |
| JP | 11-282896 | 10/1999 |
| JP | 2001-148425 | 5/2001 |
| JP | 2001-160078 | 6/2001 |

* cited by examiner

*Primary Examiner*—Thuan Do
(74) *Attorney, Agent, or Firm*—Mattingly, Stanger, Malur & Brundidge, P.C.

(57) ABSTRACT

A delay diagnosis method is proposed that can avoid design steps from being retraced or repeated uselessly due to defective delay when we design a semiconductor integrated circuit including a plurality of blocks. This delay diagnosis method has the steps of inputting logic information and floor plan information, finding the number of start points connected to the end point of a path from the logic information, computing the logic stage number of the path from the number of start points, finding block-to-block distances from the floor plan information, computing intra-block delays from the logic stage number and gate unit-value delays, computing inter-block delays from the block-to-block distances and routing unit-value delays, and diagnosing if the delay of the path after logic synthesis can be converged within a target path delay from the relation among the computed intra-block delays and inter-block delays and the target path delay.

16 Claims, 9 Drawing Sheets

DELAY DIAGNOSIS METHOD FOR SEMICONDUCTOR INTEGRATED CIRCUIT, COMPUTER PROGRAM PRODUCT FOR DIAGNOSING DELAY OF SEMICONDUCTOR INTEGRATED CIRCUIT AND COMPUTER READABLE RECORDING MEDIUM RECORDING PROGRAM THEREON

BACKGROUND OF THE INVENTION

The present invention generally relates to methods of designing semiconductor integrated circuits, and particularly to a method of diagnosing if a path delay of a semiconductor integrated circuit including a plurality of blocks can be converged within a target path delay before logic synthesis.

We have various techniques for countermeasure against defective delay paths in the design of semiconductor integrated circuits. For example, in the technique disclosed in JP-A-2888708, delay analysis is made after placement and routing, and if there is a defective delay path, cell displacement is made or circuit alteration is performed after turning back to logic design against the defective delay path. In another case of JP-A-2001-148425, delay analysis is made after cell placement but before routing, and cells are relocated against defective delay paths. Moreover in JP-A-11-282896, delay analysis is made after placement and routing, and the modification against the defective delay path is sorted into net list change, layout change or logic change according to the result of the analysis, then that sort of change being made against the defective delay path.

In other words, the above techniques analyze the net list after logic synthesis or the result of placement and routing and improve the delay according to the analysis against the defective delay path.

SUMMARY OF THE INVENTION

In the prior art described above, however, it is not sure that the path to be improved in delay is converged within a target path delay after this improving process. Therefore, manpower has been used to repeat the logic synthesis and placement and routing again and again and to find the limit of the delay improvement. In addition, since a path extended over a plurality of blocks is not taken into account, the improvement in delay between blocks, particularly countermeasure against delay of a long routing-length between blocks, is not described yet. Moreover, since the improvement process is made after the logic synthesis or the placement and routing, the design process is-required to retrace its steps once it is found that the path delay cannot be converged within a target path delay, thus unfortunately increasing the design period.

Figure 7A:
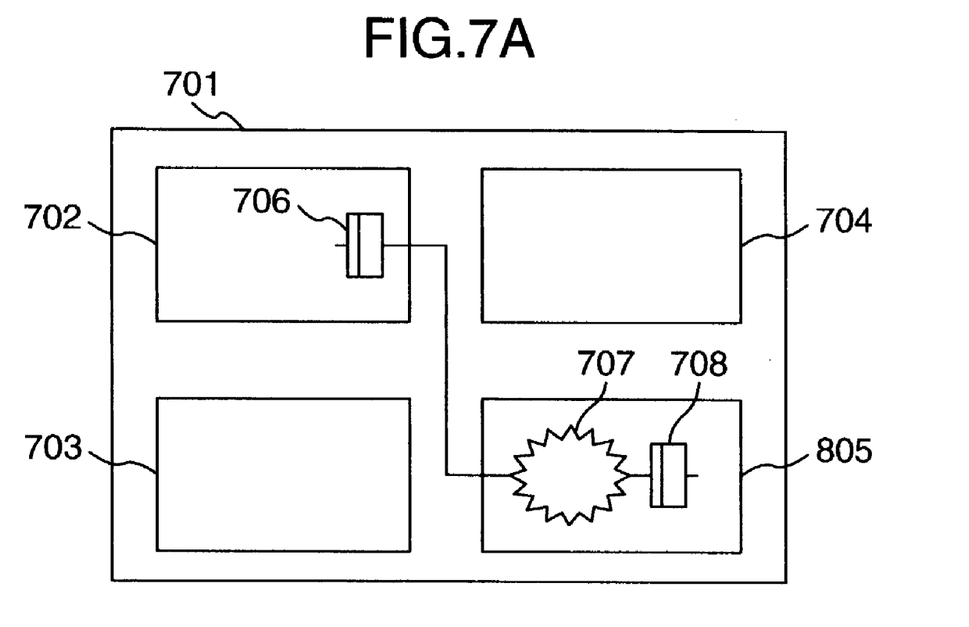
FIGS. 7A and 7B are diagrams showing an example of the countermeasure against defective delay path.
Figure 7B:
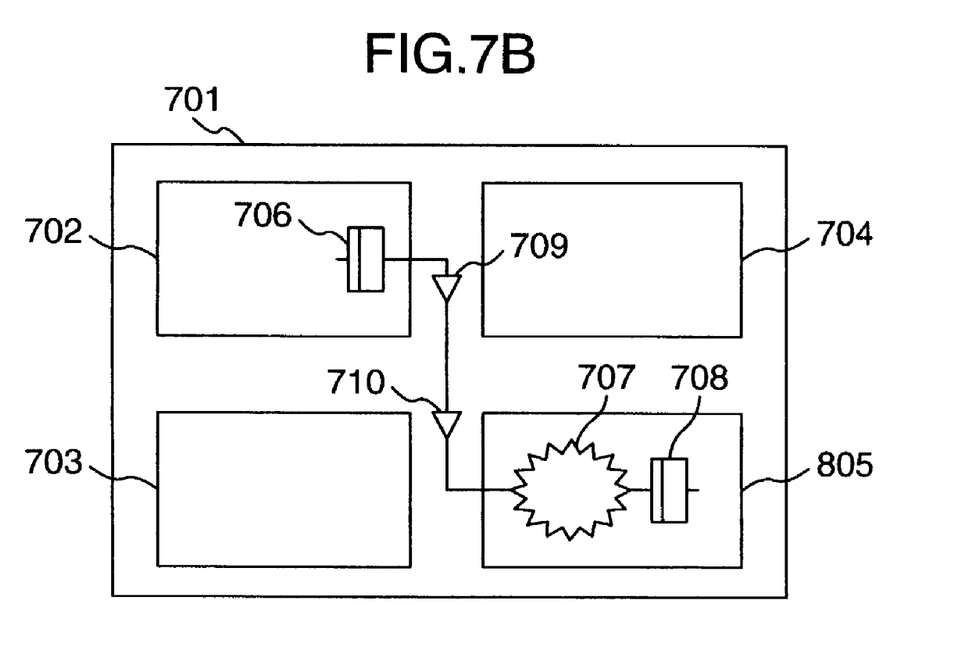

FIGS. 7A and 7B show an example of countermeasure against defective delay. FIG. 7A shows a chip 701 that has blocks 702~705 placed, and that has a defective delay path extended from a start point 706 of block 702 to an end point 708 of block 705 that includes a combination circuit 707. We first analyzed the results of placement and routing within each of the blocks associated with this defective delay path, and found that the cells were not much separated and that there was no detour routing. In addition, we checked to see if the cells have low drivability and found that there was no cell that has low drivability in connection with fan-out number and source cell.

Then, we analyzed the results of placement and routing between blocks and found that there was no detour routing. However, since the distance between the blocks was long, we inserted buffers 709 and 710 as shown in FIG. 7B and as a result we improved the delay so that the delay can be converged within the target path delay. In this example, we did not consider the method for placement and routing between blocks, and thus had to redesign the placement and routing between blocks.

Figure 8A:
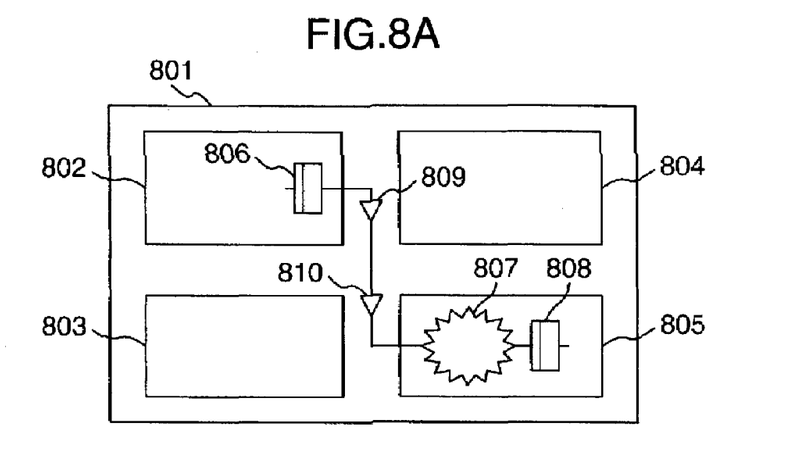
FIGS. 8A, 8B and 8C are diagrams showing another example of the countermeasure against defective delay path.
Figure 8B:
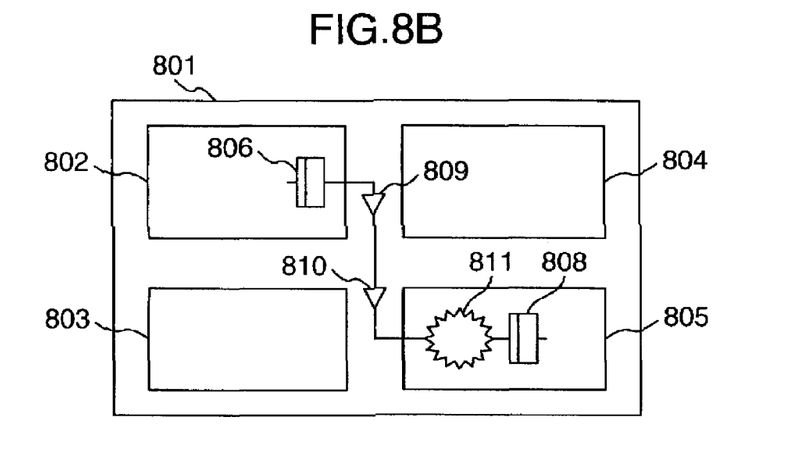
Figure 8C:
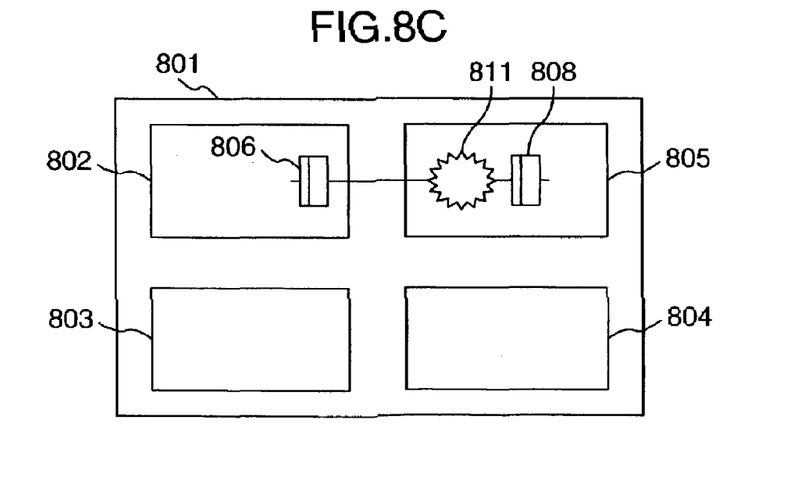

FIGS. 8A, 8B and 8C show another example of the countermeasure against defective delay. FIG. 8A shows a chip 801 that has blocks 802~805 disposed, and that has a defective delay path extended from a start point register 806 of block 802 to an end register 808 of block 805 that includes a combination circuit 807. Since the distance between blocks was long, we inserted buffers 809 and 810. We checked to see what caused this defective delay path, and found that the results of placement and routing within each block were successful, and that there was no cell that runs short of driving force. In addition, we found that there was no detour routing between blocks, and that the buffers were inserted in proper positions.

Then, when we returned to the logic design, and modified the logical description or reconsidered the constraint to logic synthesis to again synthesize the logic, we achieved a combination circuit 811 that improved the delay as shown in FIG. 8B. However, the delay could not be converged within the target path delay.

Thus, as show in FIG. 8C, we reconsidered the floor plan, transposing the blocks 804 and 805, or alternately changing the layout positions of the blocks and making the routing to each block. As a result, the block-to-block distance became short so that the delay could be improved without buffer, or converged within the target path delay. In addition, we found that when the placement and routing was changed according to the reconsidered floor plan, the delay could be converged within the target path delay without re-synthesizing the logic. In this example, since we could not predict the delay between blocks after the placement and routing process when we considered the floor plan that determines the positions of the blocks on the chip, we needed to try again a floor plan. In addition, since we did not know a delay portion within each block, we eventually made unnecessary re-synthesis.

Figure 9A:
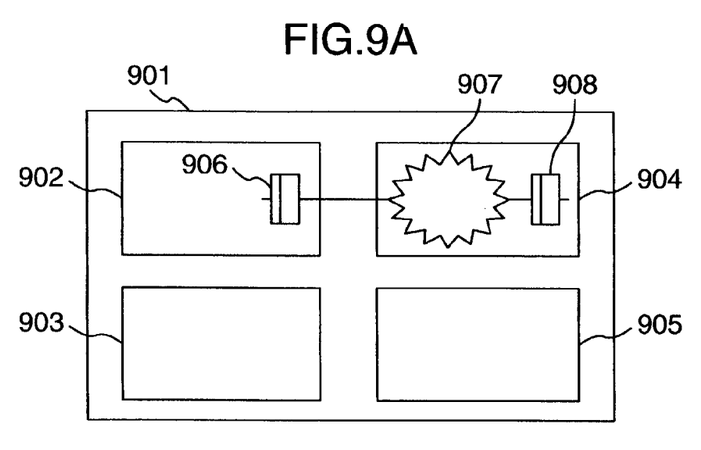
FIGS. 9A, 9B and 9C are diagrams showing still another example of the countermeasure against defective delay path.
Figure 9B:
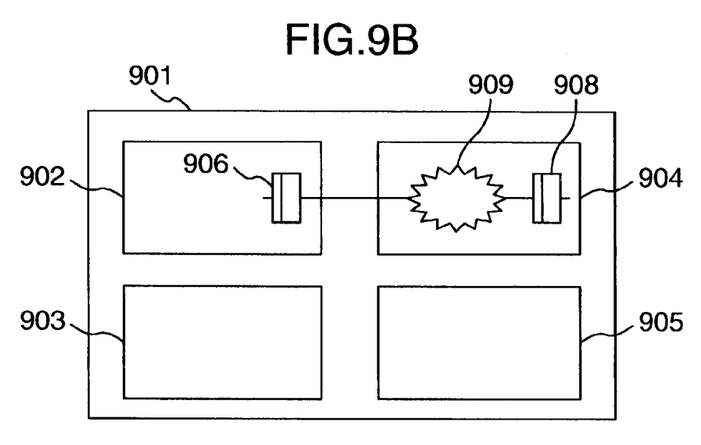
Figure 9C:
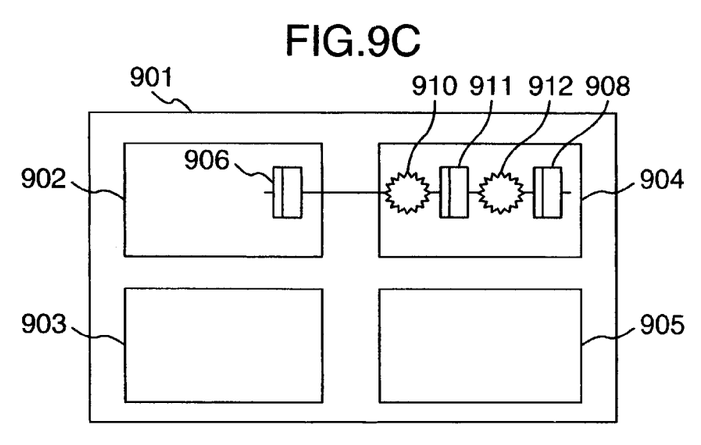

FIGS. 9A, 9B and 9C show still another example of the countermeasure against defective delay. FIG. 9A shows a chip 901 that has blocks 902~905, and that has a defective delay path extended from a start point register 906 of block 902 to an end point register 908 of block 904 that includes a combination circuit 907. Since the block-to-block distance was short, we did not need to insert buffers. The results of placement and routing within each block were satisfied. There was no detour routing between blocks, and the distance between blocks was not so long that we needed the effect of buffer insertion. Moreover, the floor plan had no room to improve more.

Thus, when we returned to the logic design process and reconsidered the modification of the logical description or the constraint for the logic synthesis, or made the re-synthesis of logic, we improved the delay as shown by a combination circuit 909 in FIG. 9B. However, the delay could not be converted within the target path delay.

Since the delay could not be improved more by the logic synthesis and placement and routing process, we returned back to the function design. As a result, the defective delay path was converged within by altering the logic to the path extended from the register 906 to a register 911 that includes a combination circuit 910 and the path extended from the register 911 to the register 908 that includes a combination circuit 912 as shown in FIG. 9C, and the delay could be converged within the target path delay after synthesis and placement and routing process. In this example, since we could not predict the limit of the logic synthesis, we needed to return back to the function design after placement and routing process.

In order to reduce the number of processes for the countermeasure against defective delay, from the viewpoint of the above three examples it is necessary to consider the placement and routing between blocks in a semiconductor integrated circuit that includes a plurality of blocks, and to design with the limits of placement and routing and logic synthesis being predicted.

The present invention is to provide a delay diagnosis method for diagnosing if the path delay can be converged within a target path delay without logic synthesis and placement and routing process in order to prevent the steps of the design from being retraced and the number of useless repetitive processes from increasing due to defective delay when a semiconductor integrated circuit including a plurality of blocks is designed.

According to the invention, there is provided a method of diagnosing the delays in a semiconductor integrated circuit that includes a plurality of blocks, this method having the steps of inputting register transfer level logic information that includes connection information of the blocks, and floor plan information that includes positional information of each block on the semiconductor integrated circuit, finding the number of registers or edges as the start point of said path connected to a register or an edge as the end point of said path, computing the logic stage number of the path from the number of registers or edges as the start point of said path, finding block-to-block distances from the floor plan information when the path extends over a plurality of blocks, computing intra-block delays from the logic stage number and gate unit-value delays, computing inter-block delays from the block-to-block distances and routing unit-value delays, and diagnosing if the delay of the path can be converged within the target path delay from the relation among the computed intra-block delays, the computed inter-block delays and the target path delay.

Thus, according to the invention, the diagnosis of if the path delay can be converged within the target path delay is performed only once before logic synthesis as compared with the prior art in which man power has been used to obtain the limit of delay improvement by repeating the logic synthesis and placement and routing process over and over again. If this diagnosis is made after the logic synthesis or placement and routing, the cause of deflective-delay path can be found by comparing the estimated result with the actual result of the logic synthesis and placement and routing process when the estimated result shows that the path delay can be converged within but the actual result shows that the path delay cannot be converged within.

Other objects, features and advantages of the invention will become apparent from the following description of the embodiments of the invention taken in conjunction with the accompanying drawings.

DESCRIPTION OF THE EMBODIMENTS

Figure 10:
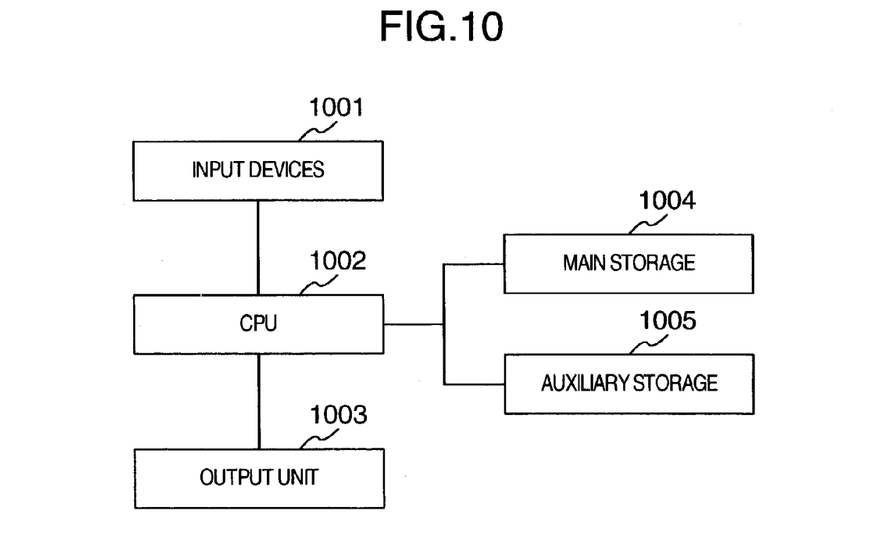
FIG. 10 is a block diagram of apparatus for executing the delay diagnosis method according to the invention.

Embodiments of the invention will be described with reference to the accompanying drawings. FIG. 10 is a block diagram showing the construction of an apparatus for embodying the invention. The delay diagnosis method according to the invention is stored as a program in an auxiliary storage 1005 that exists as a hard disk. The auxiliary storage 1005 has also design information stored therein for diagnosing the delay that will be described later with reference to FIG. 11. To execute the method according to the invention, a command is entered through a keyboard as one of input devices 1001 to direct a CPU 1002 to start the execution of delay diagnosis. Then, the program in the auxiliary storage 1005 is loaded into a main storage 1004, and executed by the CPU 1002. An output unit 1003 such as a display or printer can confirm the diagnosed result after execution.

Figure 11:
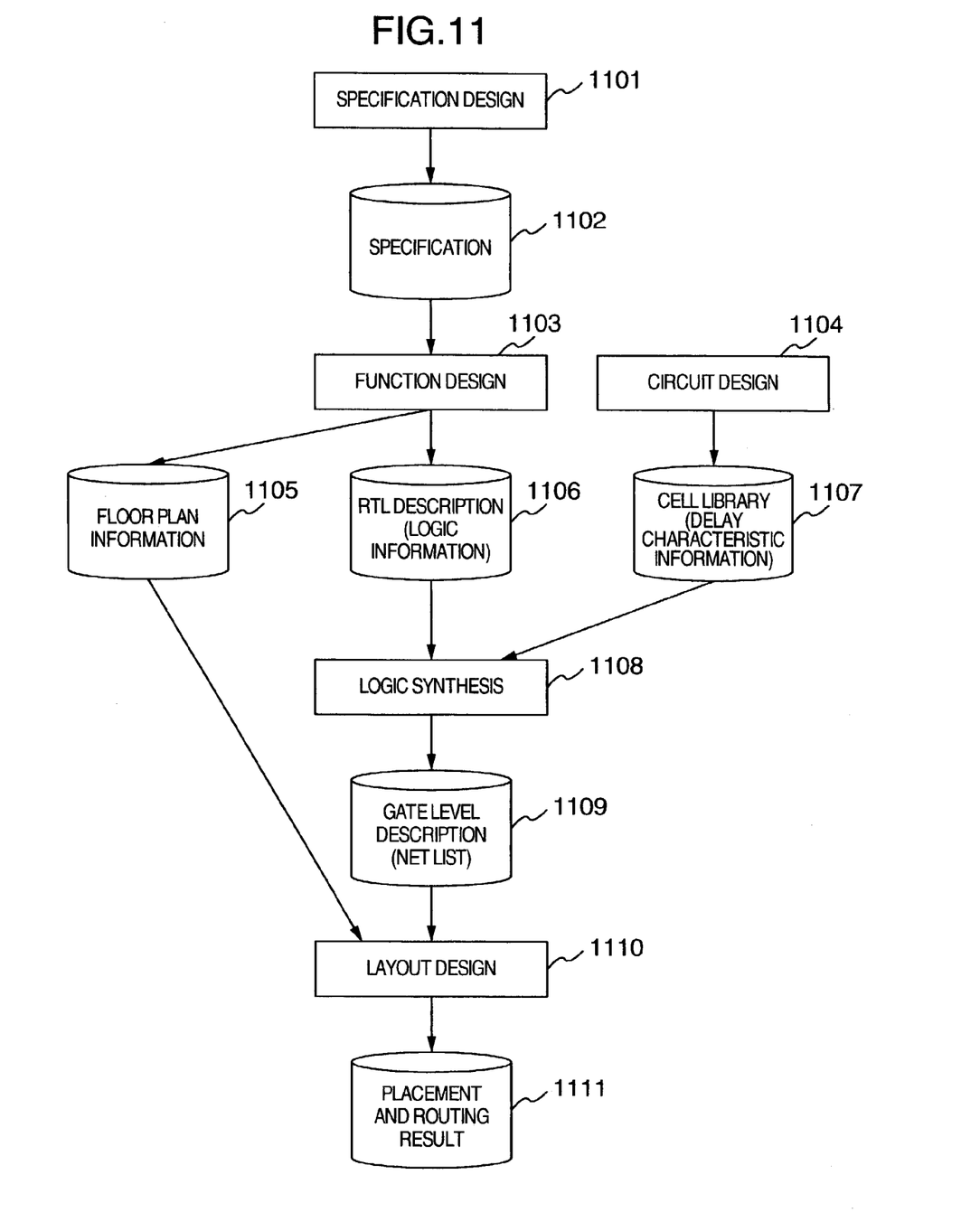
FIG. 11 is a flowchart of design steps for semiconductor integrated circuits, and of input/output information at each step.

FIG. 11 shows design steps for semiconductor integrated circuits, and input/output information at each step. A specification design 1101 determines specifications such as architecture and target performance of a semiconductor integrated circuit to be designed. A function design 1103 divides the semiconductor integrated circuit into blocks of functions according to a specification 1102, and converts each function block into an RTL description (logic description) 1106 that is formed of registers and a combination circuit connected thereto. It also makes a floor plan for determining where each division, or block should be located on the chip. A logic synthesis 1108 converts the RTL description 1106 into an actual gate level description (net list) 1109. At this time, it employs a cell library 1107 designed in a circuit design 1104. A mounting or layout design 1110 makes placement and routing on the basis of the gate level description 1109 and floor plan information 1105 created in the function design 1103.

The prior art has employed the gate level description 1109 and placement and routing result 1111 given in FIG. 11 to diagnose delay and to cope with defective delay. The delay diagnosis method according to the invention, however, needs only the registers in the logic and the edge connection relationship as logic information, the positions of blocks on the chip as floor plan information, and the computed delay information of routing lengths as delay characteristic information. Therefore, use of floor plan information 1105, RTL description 1106 and delay characteristic information 1107 will make it possible to diagnose delay without logic synthesis and package design. In addition, even after the logic synthesis or package design, the delay diagnosis can be made by use of the gate level description 1109 and placement and routing result 1111.

Figure 1:
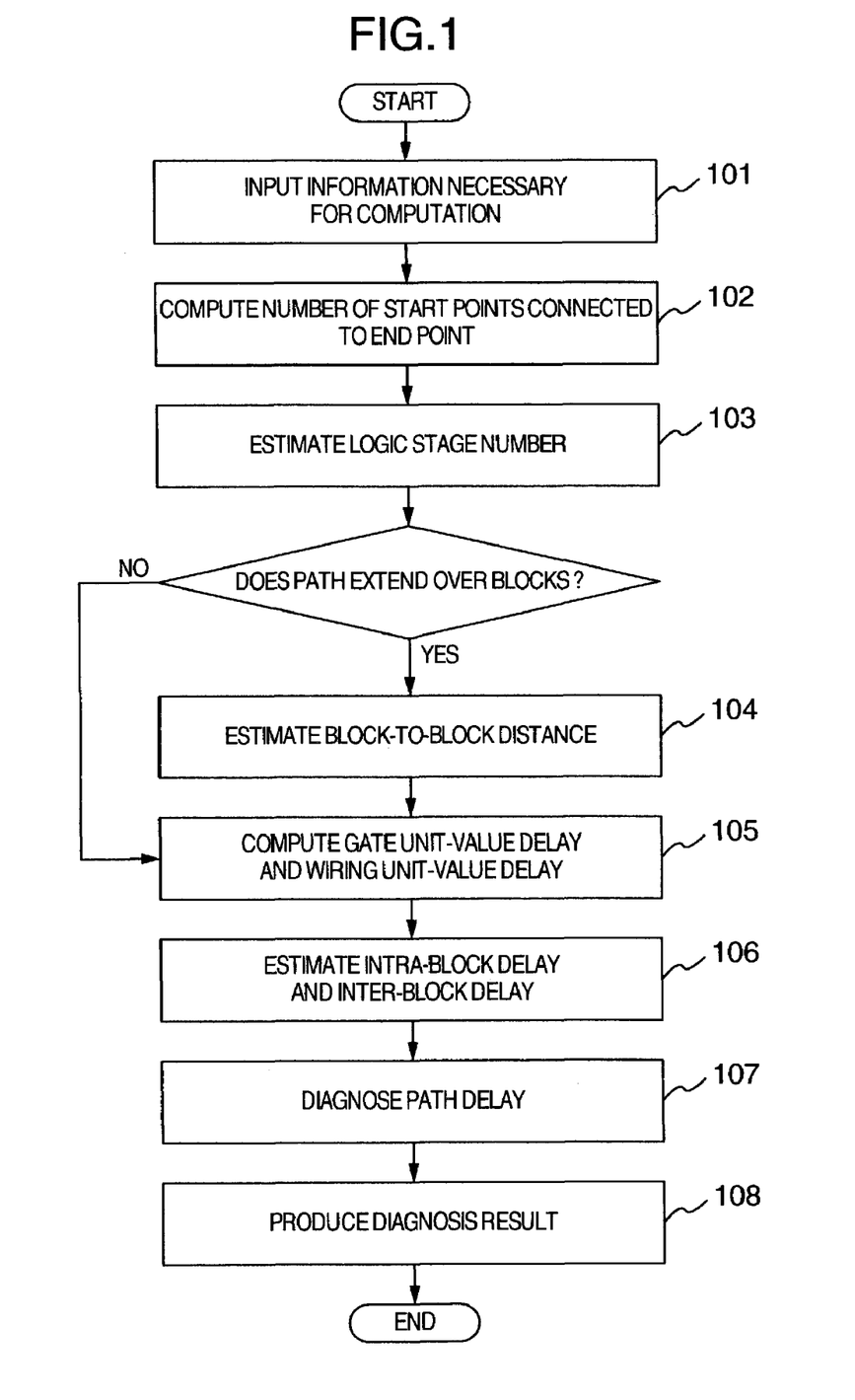
FIG. 1 is a flowchart of a delay diagnosis method according to the invention.

FIG. 1 is a flowchart of path delay diagnosis according to the invention. In step 101 of FIG. 1, logic information, floor plan information and delay characteristic information are entered as necessary information for computation of path delay. The logic information includes a connection relationship of registers and edges in the logic that includes a relationship of connection between the blocks. The floor plan information includes the positions of blocks on the chip and the block shape information. The delay characteristic information is the computed delay of routing lengths for each kind of source cells and routing.

Figure 2:
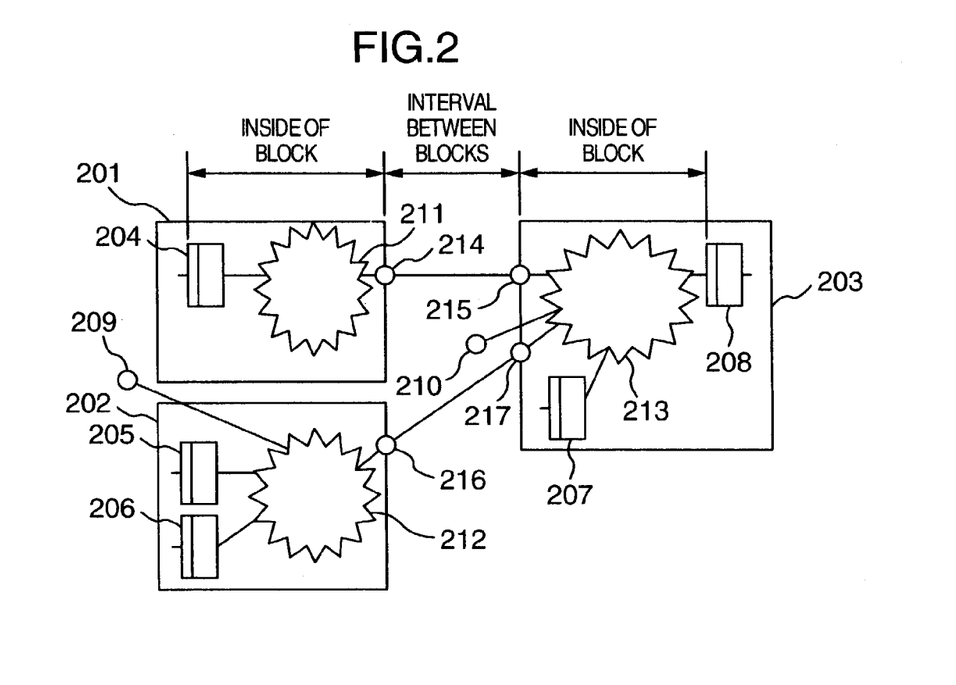
FIG. 2 is a diagram useful for explaining the path.

In step 102, the logic information is analyzed as shown in FIG. 2 and the number of start points connected to the end point is found. FIG. 2 shows an example of the path that is formed of a plurality of blocks. In a block 201, the output of a register 204 is connected through a combination circuit 211 to a port 214. In a block 202, the outputs of registers 205 and 206 and an input edge pin 209 are connected through a combination circuit 212 to a port 216. In a block 203, the output of a register 207, an input edge pin 210, and ports 215, 217 are connected through a combination circuit 213 to a register 208. The blocks are connected such that the port 214 of block 201 is connected to the port 215 of block 203, and that the port 216 of block 202 is connected to the port 217 of block 203. In other words, the end point register 208 shown in FIG. 2 is connected to the start point registers 204~207 and input edge pins 209, 210.

Figure 3:
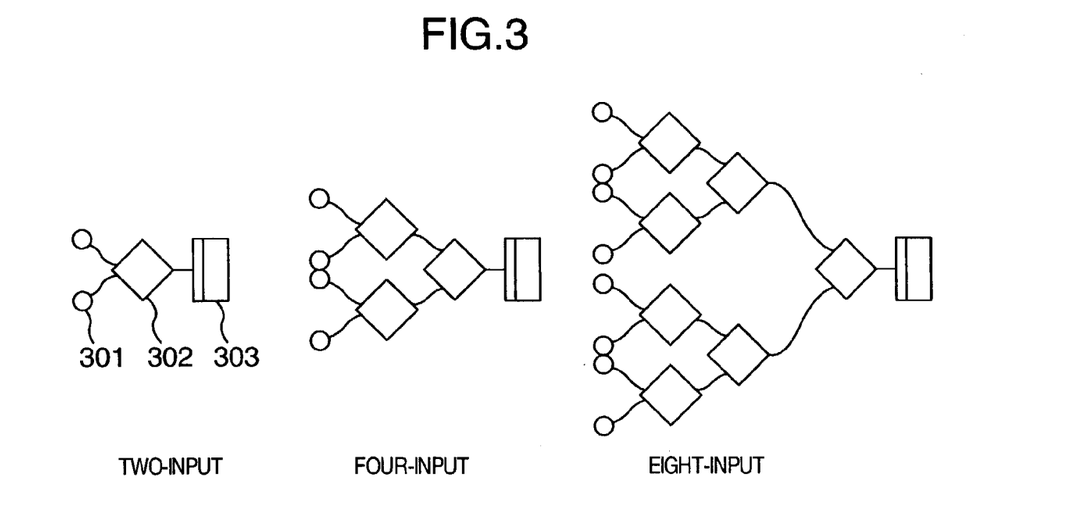
FIG. 3 is a diagram showing the relation between input number and logic stage number.

In step 103, the number of logic stages in the path is estimated from the number of start points obtained in step 102. Here, the minimum number of logic stages is estimated when the numbers of stages in paths are made equal by use of only logic elements of two-input/one-output. FIG. 3 shows the relationship between input number and logic stage number. That is, when the number of inputs is 2, one stage of a two-input/one-output logic element 302 is provided for two inputs 301. When the number of inputs is four, two stages of two-input/one-output logic elements are provided for four inputs. When the number of inputs is eight, three stages of two-input/one-output logic elements are provided for eight inputs. Thus, you will see that N stages of such elements can be provided for up to $2^N$ inputs. In other words, if the number of inputs is represented by M, the relationship between stage number N and input number M can be expressed by $N=\log_2 M$. When the start point is a register, the logic stage number can be given by the equation, $N'=1+\log_2 M$ since the start point register is added. Thus, the substitution of the previously estimated start-point number into the above equation results in the estimated logic stage number of paths.

Figure 4A:
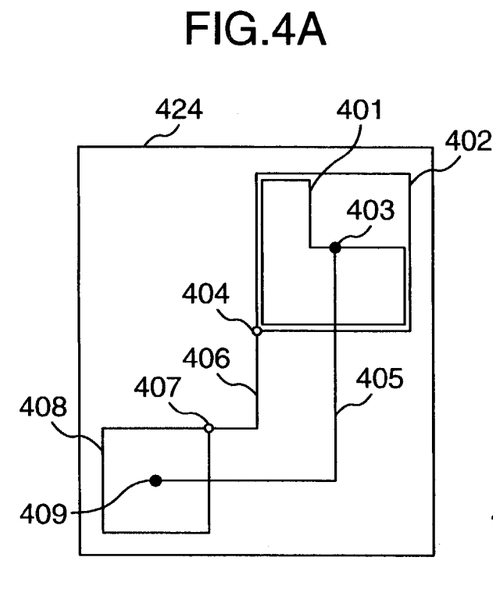
FIGS. 4A, 4B and 4C are diagrams showing block-to-block distances.
Figure 4B:
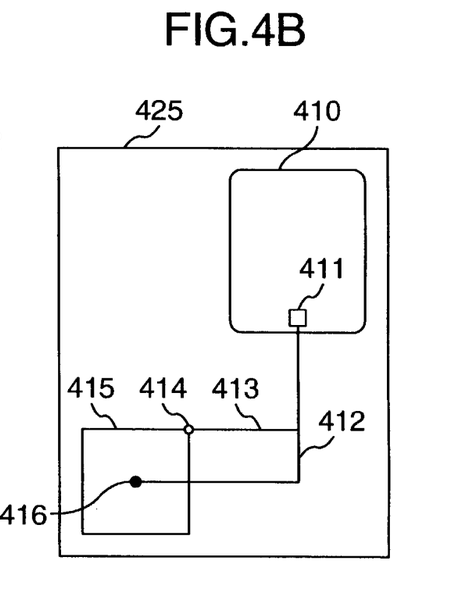
Figure 4C:
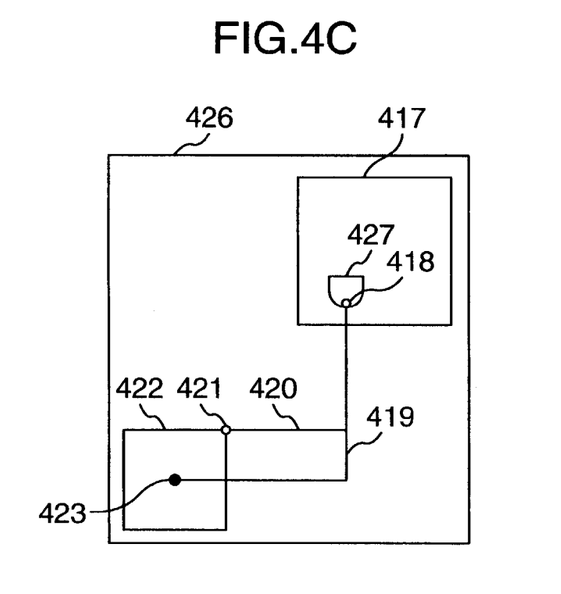

In step 104, if a path extends from block to block, the block-to-block distance is estimated from the floor plan information. Referring to FIG. 4A, we determine the shape of a block 401 of a chip 424, and compute an outermost rectangle 402 of the block, and center coordinates 403 of the rectangle. Then, we similarly determine center coordinates 409 of an outermost rectangle 408, and estimates the block-to-block distance as a center-to-center distance 405 between the central coordinates 409 and 403. The block-to-block distance will be variable from the shortest distance to the longest distance if we also connect the opposite edges of the outermost rectangles of blocks as the shortest distance. If cells of the outermost rectangles are located closer to their block edges than the center-to-center distance, the block-to-block distance can be considered as a distance 406 between the supposed positions 404, 407 of the cells. Also, if a macro cell 410 is provided on a chip 425 as shown in FIG. 4B, the block-to-block distance is determined to be a distance 412 between pin coordinates 411 of the macro cell 410 and central coordinates 416 of a block 415. Similarly to the case of FIG. 4A, a distance 413 between the pin-coordinates 411 of the macro cell and a supposed position 414 of a cell of the block 415 may be selected as the block-to-block distance. In addition, if a block 417 has a cell fixedly located on a chip 426 as shown in FIG. 4C, the block-to-block distance is determined as a distance 419 between pin coordinates 418 of the cell 427 and central coordinates 423 of a block 422. Similarly to the case of FIG. 4A, a distance 420 between the pin-coordinates 418 of the cell 427 and a supposed position 421 may be selected as the block-to-block distance.

Figure 5:
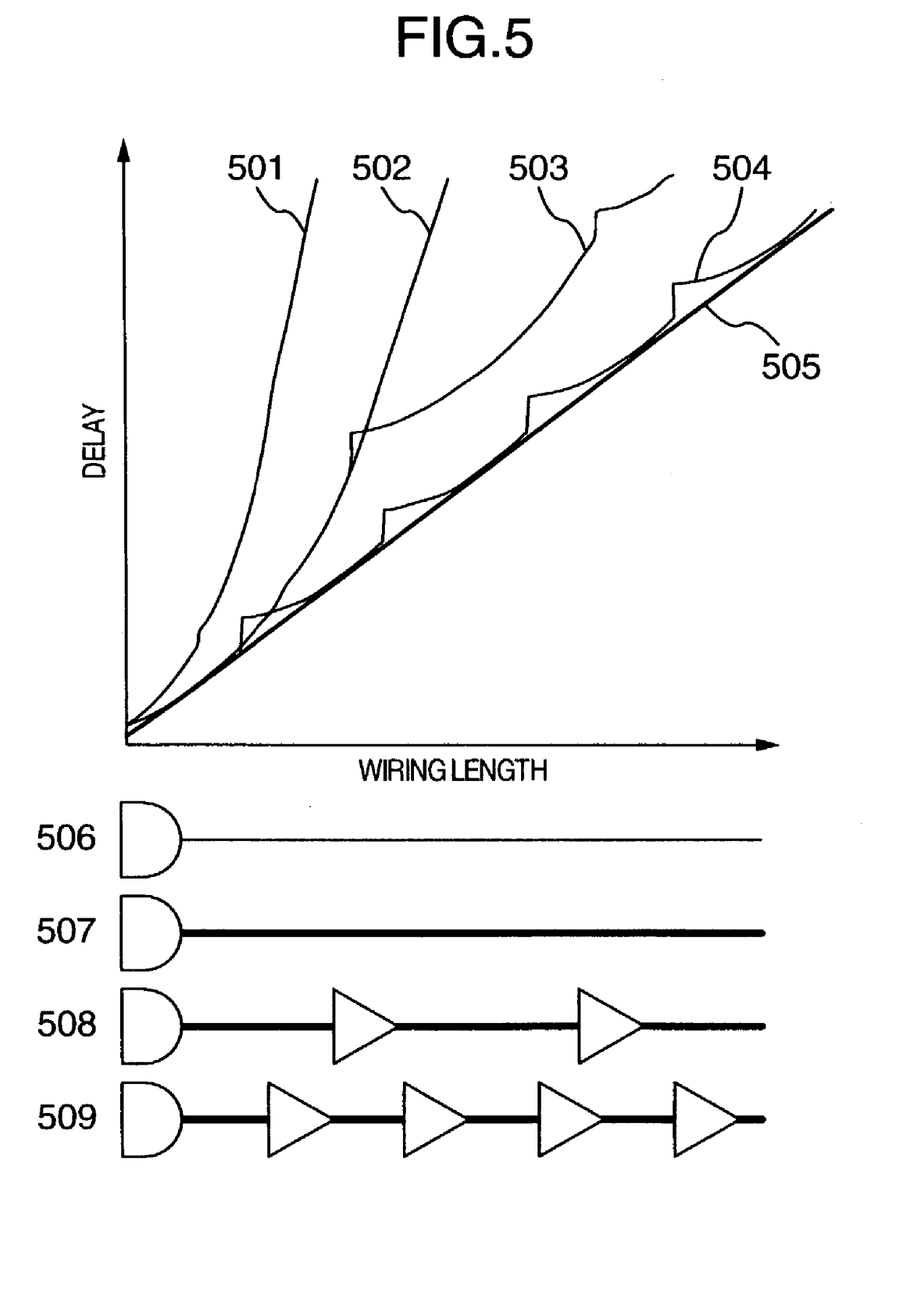
FIG. 5 is a diagram showing delay characteristics.

The step 105 computes gate unit-value delay and routing unit-value delay on the basis of delay characteristic information. The gate unit-value delay is such delay that, for example, the fundamental cell is a source cell, and that the routing length is the average of the nets within block. How to estimate the routing unit-value delay will be described with reference to FIG. 5. FIG. 5 shows delay characteristics. A routing method 506 is the normal routing that has a routing delay characteristic 501 in which the delay is suddenly increased with the increase of routing length. A routing method 507 is wide-line routing that has a routing delay characteristic 502 in which the curve is slightly gentle, but the delay is similarly increased with the increase of routing length. A routing method 508 is the routing that has buffers inserted at certain intervals, and that has a routing delay characteristic 503 in which signals can be transferred over a longer distance. If we optimize the number of and positions of buffers to be inserted as in a routing method 509, the quickest buffer insertion rule can be defined as in a routing method 509. This is called a quickest rule 505. The delay of this rule can be approximated to a linear characteristic. If this is given to the above-mentioned block-to-block distance as routing length, we can estimate the block-to-block delay at the time of application to the quickest rule.

In step 106, intra-block delay and inter-block delay can be estimated by use of the stage number, block-to-block distance, gate unit-value delay and routing unit-value delay found in steps 103, 104 and 105. The path delay can be obtained by summing up the intra-block delay and inter-block delay.

In step 107, it is decided if the path delay can be converged within a target path delay from the intra-block delay and inter-block delay estimated in step 106, and target path delay. In other words, if the path delay, or the sum of the intra-block delay and inter-block delay is within the target path delay, it is decided that the path delay can be converged within the target path delay. If the path delay is larger than the target path delay, it is decided that the path delay cannot be converged within the target path delay. In addition, when the path delay cannot be converged within the target path delay, the cause is diagnosed. When the intra-block delay alone exceeds the target path delay, the logic stage number is decided to be large. When the inter-block delay alone exceeds the target path delay, the block-to-block distance is decided to be long. When only the sum of the intra-block delay and inter-block delay exceeds the target path delay, at least either the block-to-block distance is decided to be long relative to the logic stage number or the logic stage number is decided to be large relative to the block-to-block distance.

Figure 6:
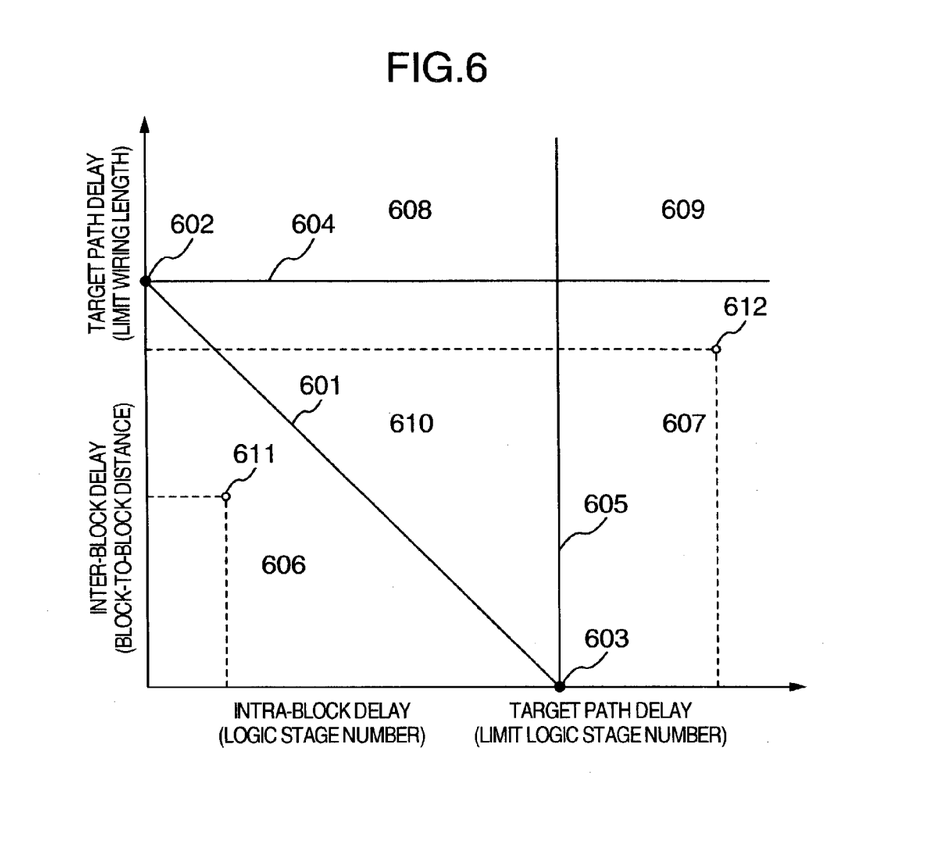
FIG. 6 is a diagram showing a method of deciding if delay can be converged within a target path delay.

Step 108 produces a two-dimensional graph as shown in FIG. 6. FIG. 6 is a two-dimensional graph in which the abscissa is the intra-block delay and the ordinate is the inter-block delay. The white circles 611, 612 in FIG. 6 are respectively paths plotted according to the intra-block delay estimated from the logic stage number and to the inter-block delay estimated from the block-to-block distance. The diagonal line 601 indicates that the sum of the intra-block delay and inter-block delay is the target path delay. Thus, the paths in which the sum of the intra-block delay and inter-block delay is smaller than the target path delay can be decided for their delays to be converged because they lie in a region 606 below the line 601. The paths in which the sum is larger than the target path delay can be decided for their delays not to be converged because they lie above the line 601. The intersection of the line 601 and the ordinate, or black circle 602 indicates that the inter-block delay alone reaches the target path delay. Thus, the block-to-block distance of the path at this point can be computed from the expression, target path delay÷routing unit-value delay, and called limit routing-length. Similarly, the intersection of the line 601 and the abscissa, or black circle 603 indicates that the intra-block delay alone reaches the target path delay. Thus, the logic stage number of the path at this point can be calculated from the expression, target path delay÷gate unit-value delay, and called limit logic-stage number. If we draw straight lines 604, 605 perpendicular to the ordinate and abscissa from these intersections 602, 603, respectively, the cause of disabling the convergence can be diagnosed. Since the region 607 in which the intra-block delay alone reaches the target path delay is the case where the logic stage number exceeds the limit logic-stage number, this case is diagnosed to have a large number of logic stages. Since the region 608 in which the inter-block delay alone exceeds the target path delay is the case where the block-to-block distance exceeds the limit routing-length, this case is diagnosed to have a long block-to-block distance. Since the region 609 in which both the intra-block delay and inter-block delay exceed the target path delay is the case where the logic stage number exceeds the limit logic-stage number and the block-to-block distance exceeds the limit routing-length, this case is diagnosed to have a large number of logic stages and a long block-to-block distance. The region 610 in which only the sum of the intra-block delay and inter-block delay exceeds the target path display is diagnosed to be at least any one of the case in which the block-to-block distance is long relative to the logic stage number and the case in which the logic stage number is large relative to the block-to-block distance. Thus, the path 611 has a delay that can be converged since it is within the region 606, but the path 612 has a delay that cannot be converged since it lies above the line 601. In addition, the path 612 is decided to have a large number of logic stages since it lies within the region 607.

In addition to the above diagnosis of delay, we can generate the restriction value for logic synthesis to be given to the input/output port of block. Since the logic synthesis is made at each block, the target delay of each block is not known when the path extends from block to block. Thus, it is necessary that the delay value on the outside of block be given to the input/output port as the restriction value. This delay corresponds to the length from the start point register to the input port when the input/output port is the input port, or to the length from the output port to the end point register when the input/output port is the output port. For example, the restriction value to be given to the port 214 through which a path passes from the start point register 204 to the end point register 208 as in FIG. 2 is the sum of the inter-block delay and the intra-block delay of block 203. Since the intra-block delay portions of the path are obtained by subtracting the inter-block delay from the target path delay, these portions are divided into the intra-block delay of block 201 and that of block 203. The ratios between the intra-block delay portions are, for example, made equal over all blocks that constitute the path.

In addition, when there are a plurality of routing unit-value delays, for example when there are routing unit-value delays for all routing methods of FIG. 5, it is possible to select routing methods according to the margin of the path delay to the target path delay. Here, it is assumed that a certain path is decided for its delay to be converged within the target path delay if routing methods 508 and 509 are selected in FIG. 5. At this time, we want to make placement and routing process between blocks by routing methods in which the amount of routing and cell area can be reduced as much as possible, we will select the routing method 508 which allows a small number of buffers to be inserted rather than the quickest routing method 509.

Since the path delay can be estimated by a computation method not depending on the results of the logic synthesis and placement and routing according to the invention, it is possible to diagnose if the path delay can be converged within the target path delay by only once executing before the logic synthesis as compared with the prior art in which the limit of delay improvement was decided by man power after repeating the logic synthesis and placement and routing over and over again so that the path delay can be converged within the target path delay. In addition, if it is executed after the logic synthesis or placement and routing process, the estimated result can be compared with the actual result of the logic synthesis and placement and routing, and thus making it possible to find the cause of defective delay in the path of which the delay cannot be converged within the target path delay. Therefore, since the cause of defective-delay path can be found from the initial stage of the design, it is possible to reduce the useless repetition of the logic synthesis and placement and routing and to avoid the design from retracing the steps.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A delay diagnosis method for a semiconductor integrated circuit including a plurality of blocks, comprising the steps of:
    inputting register transfer level logic information including connection information of said blocks, and floor plan information including positional information of each block on said semiconductor integrated circuit;
    finding the number of registers or edges as the start point of a path connected to a register or an edge as the end point of said path;
    computing the logic stage number of said path from the number of registers or edges as the start point of said path;
    finding block-to-block distances from said floor plan information when said path extends over a plurality of blocks;
    computing intra-block delays from said logic stage number and gate unit-value delays;
    computing inter-block delays from said block-to-block distances and routing unit-value delays; and
    diagnosing if the delay of said path can be converged within a target path delay from the relation among said computed intra-block delays, said computed inter-block delays and said target path delay.

2. A delay diagnosis method according to claim 1, wherein said step of computing said logic stage number computes the logic stage number in a structure using two-input/one-output logic elements so that the numbers of stages in said path can be made uniform.

3. A delay diagnosis method according to claim 1, wherein said block-to-block distances are center-to-center distances between said blocks of rectangles in the outermost shape.

4. A delay diagnosis method according to claim 1, wherein said block-to-block distances can be specified to be any value in a range between the shortest length of a line that connects the edges of said block rectangles and the longest length.

5. A delay diagnosis method according to claim 1, wherein said block-to-block distances, when at least one of said blocks is a macro cell or has a cell specified in its position on a chip, are computed by using the pin coordinates of said macro cell or the pin coordinates of said cell specified in its position.

6. A delay diagnosis method according to claim 1, wherein said routing unit-value delays correspond to a wiring method where buffers are inserted so that the transfer speed becomes the highest.

7. A delay diagnosis method according to claim 1, wherein said routing unit-value delays are one routing unit-value delay selected from a plurality of routing unit-value delays corresponding to routing methods.

8. A delay diagnosis method according to claim 1, wherein it is decided that said path delay can be converged within said target path delay if the sum of said intra-block delays and said inter-block delays is within said target path delay or cannot be converged within said target path delay if the sum of said intra-block delays and said inter-block delays is not within said target path delay.

9. A delay diagnosis method according to claim 8, wherein in the case where it is decided that said path delay cannot be converged within said target path delay, the logic stage number is decided to be large when said intra-block delays alone exceed said target path delay, the block-to-block distance is decided to be long when said inter-block delays alone exceed said target path delay, the logic stage number and the block-to-block distance are decided to be large and long, respectively, when any one of said intra-block delays and said inter-block delays exceeds said target path delay, and at least either said block-to-block distance is decided to be long relative to said logic stage number or the logic stage number is decided to be large relative to said block-to-block distance when only the sum of said intra-block delays and said inter-block delays exceeds said target path delay.

10. A delay diagnosis method according to claim 8, wherein in the case where it is decided that said path delay can be converged within said target path delay, a restriction value for use in logic synthesis of blocks is computed on the basis of said intra-block delays obtained by subtracting said inter-block delays from said target path delay.

11. A delay diagnosis method according to claim 8, wherein in the case where it is decided that said path delay can be converged within said target path delay, a method of routing between said blocks is selected according to the margin of said path delay to said target path delay.

12. A delay diagnosis method according to claim 1, wherein said step of computing said logic stage number computes said logic stage number from the expression, $$N = \log_2 M$$

where M is the number of start points of said path, and N is the logic stage number.

13. A delay diagnosis method according to claim 1, wherein the relationship among said computed intra-block delays, said computed inter-block delays and said target path delay is displayed on a two-dimensional graph.

14. A delay diagnosis method according to claim 13, wherein said two-dimensional graph has:

said intra-block delay shown on one axis and said inter-block delay shown on the other axis;

a straight line that indicates that said target path delay equals the sum of said intra-block delay and said inter-block delay;

another straight line that is perpendicular to said intra-block delay axis and indicates that said intra-block delay equals to said target path delay;

still another straight line that is perpendicular to said inter-block delay axis and indicates that said inter-block delay equals said target path delay; and path positions indicated by said intra-block delay and said inter-block delay.

15. A program product causing a computer to execute a delay diagnosis method for a semiconductor integrated circuit including a plurality of blocks, said program product having program steps of:

inputting register transfer level logic information including connection information of said blocks, and floor plan information including positional information of each block on said semiconductor integrated circuit;

finding a register as the end point of a path or a register as the start point of said path connected to edges or the number of edges from said logic information;

computing the logic stage number of said path from said a start point register of said path or said edge number;

finding block-to-block distances from said floor plan information when said path extends over a plurality of blocks;

computing intra-block delays from said logic stage number and gate unit-value delays;

computing inter-block delays from said block-to-block distances and routing unit-value delays; and diagnosing if the delay of said path can be converged within a target path delay from the relation among said computed intra-block delays, said computed inter-block delays and said target path delay.

16. A recording medium having a program recorded therein so that a computer can read said program and execute, according to said program, a delay diagnosis method of diagnosing delay in a semiconductor integrated circuit having a plurality of blocks, said program comprising the steps of:

inputting register transfer level logic information including connection information of said blocks, and floor plan information including positional information of each block on said semiconductor integrated circuit;

finding a register as the end point of a path or a register as the start point of said path connected to edges or the number of edges from said logic information;

computing the logic stage number of said path from a start point register of said path or said edge number;

finding block-to-block distances from said floor plan information when said path extends over a plurality of blocks;

computing intra-block delays from said logic stage number and gate unit-value delays;

computing inter-block delays from said block-to-block distances and routing unit-value delays; and diagnosing if the delay of said path can be converged within a target path delay from the relation among said computed intra-block delays, said computed inter-block delays and said target path delay.

* * * * *